United States Patent [19]

Makur

[11] Patent Number: 4,963,030
[45] Date of Patent: Oct. 16, 1990

[54] DISTRIBUTED-BLOCK VECTOR QUANTIZATION CODER

[75] Inventor: Anamitra Makur, Bankura, India

[73] Assignee: California Institute of Technology, Pasadena, Calif.

[21] Appl. No.: 443,103

[22] Filed: Nov. 29, 1989

[51] Int. Cl.[5] .............................................. H04N 7/13
[52] U.S. Cl. .................................... 358/133; 375/122; 381/31
[58] Field of Search ...................... 358/133; 375/122; 381/31

[56] References Cited

U.S. PATENT DOCUMENTS

| | | | |
|---|---|---|---|
| 4,853,778 | 8/1989 | Tanaka | 358/133 |
| 4,853,779 | 8/1989 | Hammer | 358/133 |
| 4,862,261 | 8/1989 | Tanaka | 358/133 |
| 4,905,259 | 2/1990 | Nardi | 375/122 |

OTHER PUBLICATIONS

Gray, Robert M., "Vector Quantization," IEEE ASSP Mag., vol. 1, No. 2, Apr. 1984, pp. 4–29.
Crochiere, R. E. et al., "Digital Coding of Speech in Subbands," Bell Sys. Tech. Jrnl., vol. 55, No. 8, Oct. 1976, pp. 1069–1985.
Aravind, R. et al., "Low-Rate Image Coding with Finite-State Vector Quantization," Proc. Intl. Conf. ASSP, 1986, pp. 137–140.
Westerink, P. H. et al., "Subband Coding of Images Using Vector Quantization," IEEE Trans. on Comm., vol. 36, No. 6, June 1988, pp. 713–719.

*Primary Examiner*—Howard W. Britton
*Attorney, Agent, or Firm*—Antonio M. Fernandez

[57] ABSTRACT

Blocks of an image or voice input signal are decimated by a selected factor d, (e.g., d=2) and distributed through a plurality ($d^2$) of ordered channels for vector quantization coding using a codebook in which vectors are ordered, such as by their average intensity. The first channel makes a full search of stored vectors in the codebook for a best match and outputs the index $m^{(1)}$ of the best match. The second channel makes a partial search for a best match over a localized region of the codebook around the index $m^{(1)}$ and outputs the index $m^{(2)}$ of the best match. The subsequent channels make partial searches over a smaller localized region of the codebook around an index that is a function of the indices $m^{(1)}$ and $m^{(2)}$. At the decoder, the indices $m^{(1)}$, $m^{(2)}$, $m^{(3)}$ and $m^{(4)}$ are used to look up vectors in a codebook identical to the coder codebook. These vectors are then assembled by a process that is the inverse of the decimation and distribution process at the encoder to output a decoded signal that is high quality replica of the input signal. The narrow search ranges in the channels following the first reduce the encoding search time and bit rate for each of the input blocks. That range may be readily changed for each channel, and therefore may be made adaptive.

6 Claims, 6 Drawing Sheets

DISTRIBUTED-BLOCK VECTOR QUANTIZATION CODER

BACKGROUND OF THE INVENTION

This invention relates to a vector quantization (VQ) coder for speech, video and the like, and more particularly to a system for extracting vectors from the source using distributed pixel blocks for images, or distributed samples for speech, as vectors. Owing to the correlation between distributed vectors, the encoding search time and the bit rate for the distributed vector quantization (DVQ) coder will be less than for the conventional VQ coder.

Vector quantization (VQ) has existed as a source coding technique for a long time, has been extensively used for speech for some years, and for video images more recently. In accordance with the rate distortion theory, vectors instead of scalars are quantized in a VQ coder to achieve better compression.

The input vectors are usually formed from the source using spatial pixel blocks for images or a set of neighboring samples (temporal blocks) for speech, and a precomputed set of representative vectors is stored in what is called a codebook. The same precomputed set of representative vectors is entered in a decoder codebook at the same corresponding addresses as in the encoder codebook. Each block of source samples of a signal to be encoded, called an input vector, is then compared with the vectors stored in the encoder codebook to find the stored codeword which best matches the input vector. The sequence number or address of this "best-match" codeword, referred to hereinafter as the index, is then emitted as the VQ code for the input vector. At the decoder, the VQ code is simply used as an address to look up the vector codeword. An overview of vector quantization has been presented in "Vector Quantization," by R. M. Gray, IEEE ASSP Mag., Vol. 1, No. 2, April 1984, pp. 4-29.

Traditionally the input vectors for VQ coding have been extracted from the source by choosing K samples (K=dimensionally of the coder) that are immediate neighbors of each other, either in a line for one-dimensional speech sources or in a rectangle for two-dimensional images as shown in FIG. 1(a), which shows for simplicity of illustration a voice input signal sampled 16 times to form an input vector, and an image input signal of 16 pixels arrayed in four rows and columns to form a 4×4 input block vector, instead of the usual K=64 or more samples of pixels. This selection of immediate neighbors for the vectors is only natural since immediate neighbors show the highest correlation, therefore the vectors tend to cluster together, which is desirable in a VQ coder.

In the distributed-block scheme of the present invention, the source sequence is decimated by a factor of d before constructing the K-dimensional vectors, as shown in FIG. 1(b) for d=2, and K=4. Note that the normal spatial-block vector for speech is a special case where d=1. For d>1, the source is split into d decimated sequences in a form which may be compared to subband coding where the frequency spectrum of the input signal is separated into a fixed number of adjacent band channels by filtering before encoding the separate channels in parallel. The subband coding channels are multiplexed for transmission and then demultiplexed at the receiver to reassemble the full bandwidth of the signal. R. E. Cochiere, S. A. Webber and J. L. Flanagan, "Digital Coding of Speech in Subbands," Bell Sys. Tech. Jrnl., Vol. 55, No. 8, October 1976, pp. 1069-1085. The distinction of the present invention over subband coding is that in the subband coding technique, the input signal is split into adjacent band channels for coding, such as for a simple example four, while in the present invention a block of 16 samples is decimated into four 2×2 (K=4) subblocks as may be readily appreciated from the four decimated subblock vectors of a 4×4 image input block shown in FIG. 1(b) for simplicity of illustration. In actual practice, a larger input block, such as 64 voice samples or image pixels would be decimated and distributed into four 4×4 subblocks.

Decimation, as the term is used in this context, is carried out by selecting pixels spaced both horizontally and vertically in a block 10 by the factor d, which in this example is 2 for first a subblock 11 and then for subblocks 12, 13 and 14 in sequence. The first decimator for subblock 11 may be implemented by a gate which is turned on for alternate pixels of alternate rows starting with the first row. The second decimator is then implemented by a gate which is turned on for alternate pixels of alternate rows starting with the second pixel of the second row. The third decimator is implemented like the first decimator but starting with the second pixel of the first row, and the fourth decimator is implemented like the second decimator but starting with the first pixel of the second row. The subblocks of a decimated input block are assembled in separate registers which are in practice linear but here shown in 4×4 blocks for ease of understanding the meaning of the term "decimation."

No information is lost in the decimating process because each decimator processes a different delayed 4×4 set of the source block sequence. Each of these subsets (subblocks) is processed separately in the search for the best match with stored vectors in the distributed vector quantization (DVQ) codebook. The indices of the best matches found in the codebook for the subblocks of an input block are assembled to form a DVQ code. However, as will be made more clear with reference to FIG. 2, and more particularly with reference to FIG. 3(a), a full search is made only for the first subblock; only a partial search of limited range oriented around the index of the first subblock is conducted for the next subblock, and the index of the best match found is then generated relative to the limited range and its orientation around the full search index. Each subsequent subblock is similarly processed with only a partial search. In that manner, the time required to encode the full block and the bit rate of the DVQ code generated are both reduced as compared to conventional VQ coding.

Upon decoding the DVQ code, the absolute full bit codes of the indices are computed for each of the subblocks in order to retrieve from the decoder codebook the same codebook vectors as were found to be the best matches in the encoding process. The codebook vectors are then assembled by inverse decimation and distribution to restore the encoded block with only a possible quantization error in some pixels. An object of this DVQ coding technique is thus to exploit the strong correlation between the distributed input block vector to reduce both the output bit rate and the encoding time per block with only some compromise in signal reproduction quality. A further objective is to facilitate adjustment of the encoder for the optimum compromise between bit rate and quality of reproduction. However, for any compromise adjustment, the decimation technique of the present invention has the desired effect of distributing any annoying quantization errors, thereby making the errors less perceptible, without requiring any extra codebook storage. This is due to the decimation factor. As it is increased, an encoded block appears more and more diffused in the decoded image, and due to the integrating effect of the human eye, blockiness disappears. However, as the factor d is further increased, the correlation between the dimensions of the vector becomes less, the clusters become more spread out, and a larger codebook size is required to achieve the same quality of reproduction as before. Thus, a trade off could be sensed between the dependence on the factor d of the two aspects of decoded image quality, but there will always exist an optimum value of the factor d for best quality within a bit rate. This optimum value is not necessarily $d=1$, as has been assumed in conventional VQ coding, but rather $d>1$, and may very well be the factor 2 chosen for the example described with reference to FIGS. 3(a) and 3(b).

It should be noted that while the illustrations used throughout for description of the present invention is an image block of pixels, the input vector block may be readily assembled from a voice signal and processed in the same way with each blocked sequence of samples decimated by a factor d into d subblocks. At the decoder the decimator and distribution process is inverted to reproduce the input blocks of samples with only some sample quantization errors occurring in the encoding-decoding sequence, but again the quantization errors will be dispersed when the rows of the block are strung out to restore the voice signal, and therefore the errors will not be perceptible.

SUMMARY OF THE INVENTION

A distributed vector quantization (DVQ) coder decimates and distributes a block of an image or voice input signal into subblocks and processes the subblocks through a plurality of channels ordered 1, 2, ... n, utilizing $n-1$ pixel or sample delay elements, one delay element between each pair of adjacent channels. The signal input to each channel is in digital form and is both decimated by a factor d and distributed among the channels to provide subblock vectors for encoding using a VQ codebook having N stored vectors. A full search for the best match between the input subblock vector $X^{(1)}$ and the codebook vectors 1 through N is made only in the first (0 delay) channel in which the source sample (pixel) sequence is decimated by a factor d, where d is an integer greater than 1, and the number of channels is $d^2$. The index $m^{(1)}$ of that best match is an p-bit VQ code output for that first channel, where $p=\log_2 N$. (The superscript indicates the channel number.) In the next channel, the signal delayed by the first delay element is also decimated by the factor d to provide a second subblock vector for coding, but only a partial search is made over a localized region within the codebook around the index $m^{(1)}$. An index $m^{(2)}$ of the best match found in the first partial search is a binary number having p-q bits, where $q<p$. That binary number specifies the location of the best match as a function of the index $m^{(1)}$. The index $m^{(2)}$ is the VQ code output for the second channel. The partial search for the next channel is similarly made over a localized region of the codebook around an index that is a function of the index $m^{(2)}$ and the index $m^{(1)}$, preferably a midpoint between $m^{(1)}$ and $m^{(2)}$. A partial search is similarly made for subsequent channels of lower order using a localized region of the codebook around an index that is at least a function of the indices $m^{(1)}$ and $m^{(2)}$. The extent of the localized region used for searching for the best match may be different for each successive channel but is preferably maintained the same small size after the second channel. The localized region may be adjusted to alter the performance of the DVQ coder.

The novel features that are considered characteristic of this invention are set forth with particularity in the appended claims. The invention will best be understood from the following description when read in connection with the accompanying drawings.

DESCRIPTION OF PREFERRED EMBODIMENTS

Figure 1A:
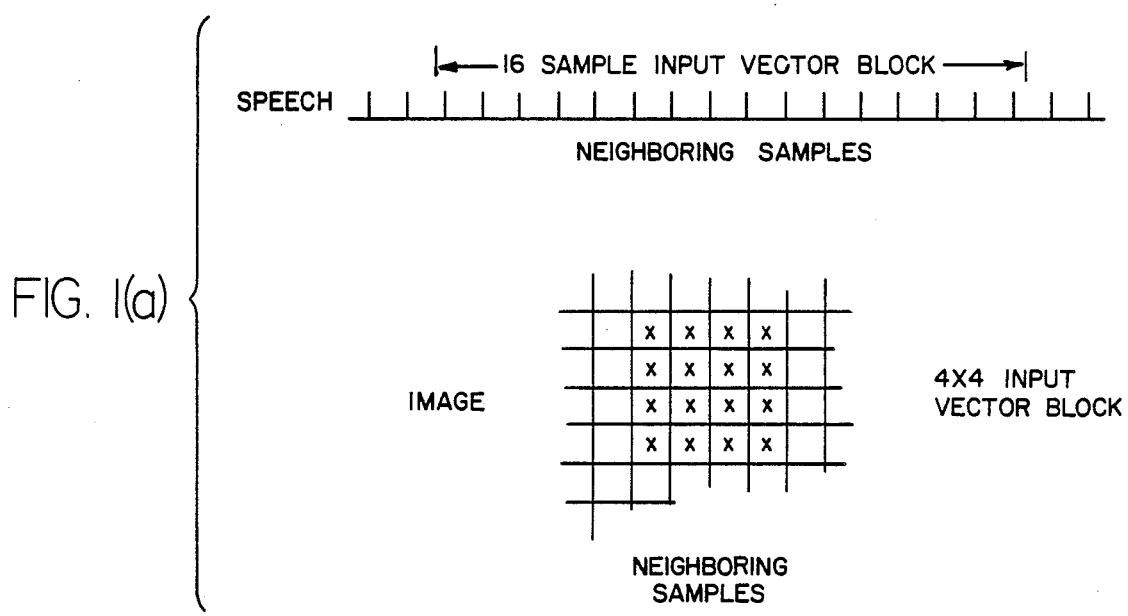
FIG. 1a illustrates a typical spatial input vector of K speech samples, e.g., K=16, and of image pixels arrayed in a 4×4 block.

Features of a distributed vector quantization (DVQ) coder and decoder will now be described with reference to FIG. 2. An image input signal comprised of a sequence of pixels in digital form is distributed by a delay line 15 consisting of cascaded pixel-time delay elements 16 to an array of decimators 17. The first decimator in the array receives the first pixel of a block sequence followed by pixels spaced by a decimating factor d in both the horizontal and vertical directions. The second decimator in the array receives the second pixel of a second row followed by pixels spaced by the decimating factor d, and so forth as described with reference to FIG. 1(b) for a 8×8 pixel block with a decimating factor of 2, although for this general description of the invention with reference to FIG. 2, the decimating factor may be any integer $d>1$.

The output of the first decimator of the array 17 is connected to a full search unit 20, and the outputs of the second and subsequent decimators of the array 17 are connected to separate partial search units 21 with one partial search unit 21 for each decimator of the array 17 after the first. The full search unit 20 and the partial search units 21 will each sometimes be referred to hereinafter as a channel. The decimation factor d may be any integer, and the number of channels is equal to $d^2$ for images, and equal to d for speech. For example, if $d=2$, the number of channels is 4 for image DVQ encoding, but only 2 for speech DVQ encoding.

Because the decimated sequences which provide the distributed block vectors as subblocks have similar probability distributions, it is necessary to design and store only one codebook 22 for subblocks of decimated and distributed input block vectors. Coders of all channels use this same codebook stored with N codewords, $C^{(1)}$ to $C^{(N)}$. The codewords are assumed to be ordered in the following fashion:

$$f(C^{(1)}) \leq f(C^{(2)}) \leq \ldots \leq f(C^{(N)}), \quad (1)$$

where $f(\cdot)$ is a similarity function on the codewords; codewords similar in intensity values and in patterns should have closer $f(C)$, and vice versa. The objective of this ordering is to have similar codewords in neighboring regions within the codebook.

Ideally, the similarity function should represent the similarity for human viewing. In practice, however, one could use some distortion measure or correlation between two codewords to determine their similarity and place them accordingly in the codebook. However, this may not result in a unique ordering. A simpler way of ordering the codebook is using the average intensity.

$$f(C) = \frac{1}{K} \sum_{k=1}^{K} c_k, \quad (2)$$

which, however, is pattern-invariant. There is no penalty in making the similarity function computationally complex, because this part of the computation is to be done only initially while designing the codebook and is not required while using the codebook in the encoding process.

Figure 1B:
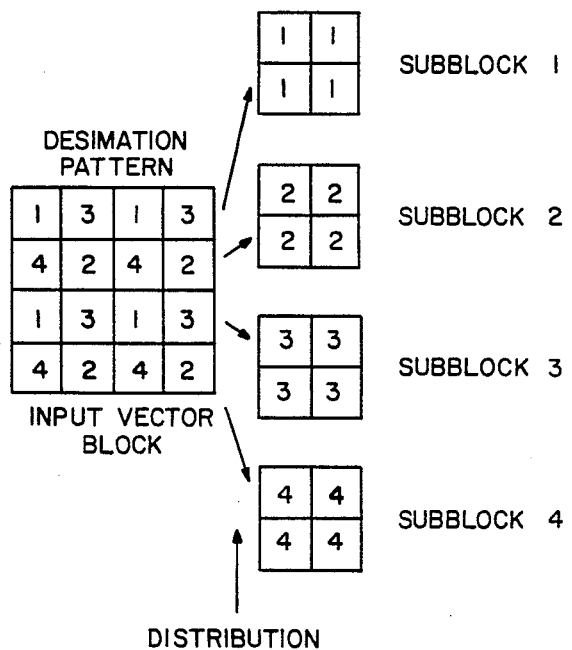
FIG. 1b illustrates a 4×4 input vector decimated by a factor $d=2$ and distributed into four 2×2 subblocks.
Figure 2:
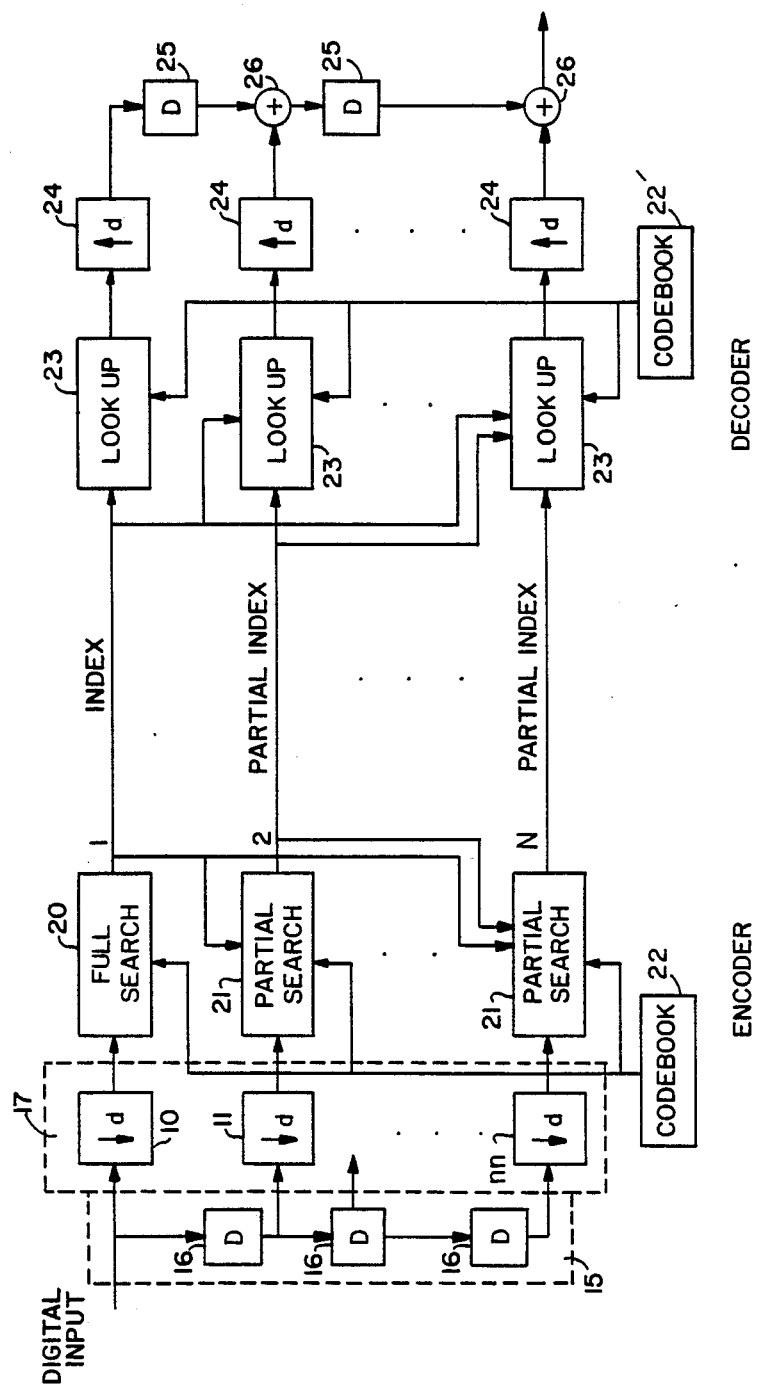
FIG. 2 is a block diagram of a distributed block vector quantization coder and decoder.

Because the decimated and distributed input vectors to the full and partial search units 20 and 21 are interlaced as illustrated in FIG. 1(b), they are much correlated. The need to exploit spatial redundance over a larger region than just the block size has been recognized before. See R. Aravind, A. Gersho, "Low-Rate Image Coding with Finite-State Vector Quantization," Proc. Intl. Conf. ASSP, 1986, pp. 137–140. A finite state VQ, for example, utilizes the correlation between the adjacent spatial vectors. The correlation between the distributed vectors is, however, much stronger than the correlation between vectors in the case of the conventional VQ coding scheme. This correlation is exploited in the present invention to reduce both the search time and the bit rate (i.e., the number of bits needed to specify the code indices of vectors) by using a full search for the first channel and partial searches in the remaining channels.

The individual search units of the distributed vector channels do not exactly operate in parallel. Instead, the coding is done in sequence through the channels, and each channel uses the information from other channels ahead of it in the distribution order to set the localized region for search. The first channel conducts a full codebook search. The partial search for the i-th channel is done over some localized region within the codebook, $$\{C^{(b_i+1)}, \ldots, C^{(e_i)}\}, \quad (3)$$

where $b_i$ and $e_i$ denote the index for the beginning and the end of this partial search region as a function of at least the index $m^{(1)}$ found by a full search in the first channel.

Thus, to begin, a search is performed in the first channel through the full codebook 22. Once this search is completed, the codeword index $m^{(1)}$ is known. The next channel then performs its search through the part of the codebook localized around $m^{(1)}$ $$b_2 = b_2(m^{(1)}) \text{ and } e_2 = e_2(m^{(1)}). \quad (4)$$

The functions $b_i(\cdot)$ and $e_i(\cdot)$ specify the range of the partial search where the closest codeword for the input vector of the i-th channel will most likely lie and could be of the form $$b_i(m) = m - \frac{R_i}{2} \text{ and } e_i(m) = m + \frac{R_i}{2} - 1, \quad (5)$$

where $R_i$ is the partial range for the i-th channel. Typically $R_i$ will be much less than N for $i > 1$, therefore the partial search will result in a partial index $m^{(i)}$ which needs fewer bits than $m^{(1)}$ to be specified. Subsequent channels will further reduce their search area using information from indices computed before, for example $$b_3 = b_3(m^{(1)}, m^{(2)}) \quad (6)$$

and so on. In order to keep the coder fixed-rate, these functions should be such that $R_i$ remains the same for any value of $m^{(i)}$, although if $m^{(i)}$ is closer to either end of the codebook than $R_i/2$, the search is cut short at that end.

Specifying the partial search range for any channel i by the parameter $R_i$ provides a degree of flexibility in adjusting the DVQ coder to a particular application and perhaps even making the DVQ coder adaptive. If the parameter $R_i$ is changed, the rate of encoding will change which may then require an adjustment in the system for maintaining synchronous operation.

The decoder constructs the indices necessary for addressing a decoding codebook 22' identical to the codebook 22 at the encoder from the received partial indices using implied information as to which is the full search index $m^{(1)}$, and which are the respective partial search indices $m^{(2)} \ldots m^{(n)}$. Therefore, no overhead is required in decoding. Each of the indices $m^{(1)}, m^{(2)}, \ldots m^{(n)}$ are transmitted to codebook look-up units 23 comprised of means for computing the absolute indices in the case of the transmitted indices $m^{(2)}, \ldots m^{(n)}$ and for separately and sequentially looking up the codewords at indices $m^{(1)}, m^{(2)}, \ldots m^{(n)}$. Each look-up unit reads out a code vector and transmits it to an associated inverse decimator 24 which distributes the subblock code vectors.

Though it is likely that the codeword with the least distortion for some input vector will lie within the partial range, with a certain probability it will not belong to the search neighborhood. In that case, the selected codeword, though optimal within the partial range, will be suboptimal when compared to the results of a full search. An appropriately chosen similarity function will result in a small probability of suboptimal decision even for a fractional search area.

The bit rate of the coder is given by $$\frac{1}{Kd} \sum_{i=1}^{d} [\log(e_i - b_i + 1)] \text{ bits per sample.} \quad (7)$$

This rate will be smaller than the bit rate for a full conventional search VQ coder, $[\log N]/K$, for any reasonable choice of search ranges. The average number of times the distortion function has to be computed for one K-dimensional vector is $$\frac{1}{d} \sum_{i=1}^{d} (e_i - b_i + 1). \tag{8}$$

For a full search coder, the corresponding number is N. Thus, the encoding computation is substantially less for the distributed-block scheme of the present invention, although the storage requirement remains the same. Because of the sequential encoding of the channels, it is possible to implement the coder using the same amount of hardware as the conventional full search VQ coder. The complexity of this DVQ coder is marginally higher than that of the conventional VQ coder due to the variable partial search range specified by the parameter R, but this is negligible compared to the complexity of the conventional VQ coder.

Consider a spatial vector quantization coder with dimensionality K and N codewords. This coder has a compression ratio of (ks/log N), where s is the number of bits per sample (or pixel) of the source, and 'log' refers to logarithm base 2. Some applications of this type of coder demand the bit rate, i.e., the compression ratio to be variable while compromising the quantization distortion. In general a larger block dimension results in a higher compression ratio for a VQ coder. However, the computational burden increases linearly with the number of dimensions. It is easy to realize that once implemented, the dimensionality K of a coder cannot be altered trivially. For a fixed K, the rate could be reduced while sacrificing quality by reducing N. A factor of 2 reduction in N will decrease the bit rate by 1/K bit per sample. In case of the tree-structured VQ, this reduction of codebook size amounts to reduction in depth of the tree and could be achieved easily. However for other VQ coders, this is not at all trivial. If a precomputed fixed codebook is to be used, for most typical sources there is a need to adapt the coder to source statistics. These facts motivate one to look for a coder which is capable of changing the rate easily at smaller steps even for fixed codebooks. The distributed-block scheme not only fulfills this goal, but computer simulations show images with better quality using this scheme compared to the conventional VQ coder.

The distribution of blocks has a desirable effect in the case of image coding. Block coding, such as with conventional VQ coders operating at low rate, results in blockiness or visibly annoying blocks of quantization noise in the decoded image display. In this DVQ coder, as the decimation factor d increases an encoded block appears more and more diffused in the decoded image display, and because of the integrating effect of the human eye the blockiness becomes less annoying. However, as the factor d increases, the correlation between the components within a vector becomes less. As a result, the clusters become more random, and larger codebook size is required to achieve the same quality as before. Thus, the decoded image quality if affected both positively and negatively for an increasing d. The optimum value of d depends mostly on the type of source. As the results will suggest, for low rate coding of gray-level images, d=2 performs better than d=1.

Figure 3A:
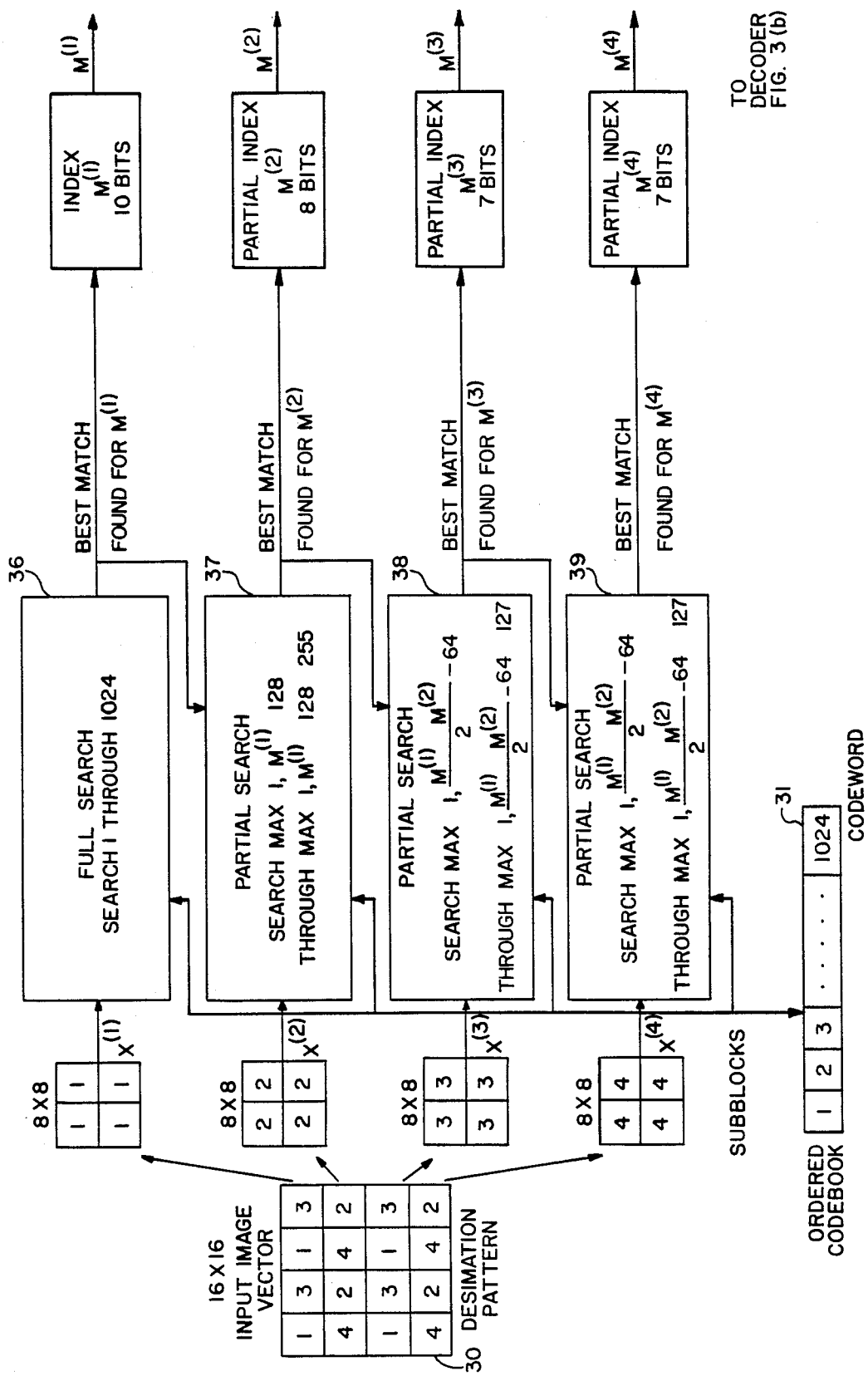
FIG. 3a is a schematic diagram of the coder in FIG. 2.
Figure 3B:
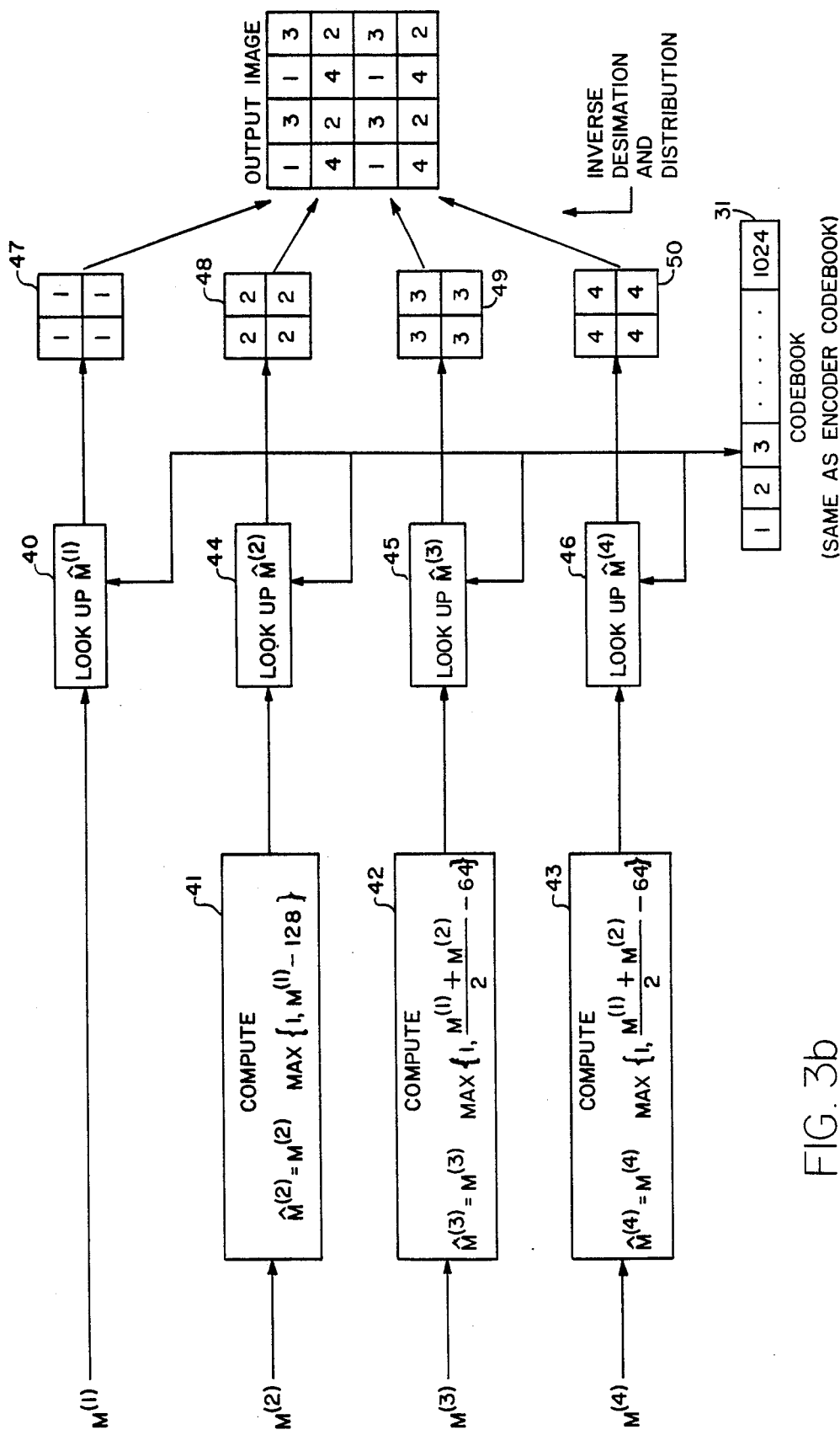
FIG. 3b is a schematic diagram of the decoder in FIG. 2.

Before presenting a performance analysis, a particular DVQ coder and decoder will now be described with reference to FIGS. 3(a) and 3(b). With reference to FIG. 3(a), assuming a 16×16 pixel vector 30 of an input image and a codebook 31 of N=1024 vectors stored in increasing order of average intensity, and assuming four distribution and decimation channels 32, 33, 34, 35, a full search for the best match of a subblock $X^{(1)}$ in the first channel is conducted through all 1024 vectors in the ordered codebook 31 by a unit 36. The 10-bit index $m^{(1)}$ of the full search best match is transmitted for subsequent decoding and entered into the first partial search unit 37. That index $m^{(1)}$ is employed in the first partial search unit 37 to set the range of search for the best match of a subblock $X^{(2)}$ from $\max\{1, m^{(1)} - 128\}$ through $\max\{1, m^{(1)} - 128\} + 255$. The index $m^{(2)}$ of the best match found for the subblock $X^{(2)}$ is transmitted to the decoder and to the next partial search unit 38. Since the first partial search in unit 37 is over a range of only 256 codewords centered on the codeword with the index $m^{(1)}$, only 8 bits are required to specify the index $m^{(2)}$ relative to $m^{(1)}$. Similarly the second partial search unit 38 sets the range of search for the best match of subblock $X^{(3)}$ $$\text{from } \max\left\{1, \frac{m^{(1)} + m^{(2)}}{2} - 64\right\}$$

$$\text{to } \max\left\{1, \frac{m^{(1)} + m^{(2)}}{2} - 64\right\} + 127.$$

The index $m^{(3)}$ for the best match of the subblock $X^{(3)}$ is over a range of only 128 codewords centered on the codeword with the average of indices $m^{(1)}$ and $m^{(2)}$. Therefore, only 7 bits are required to specify the index $m^{(3)}$ relative to $m^{(2)}$. The third partial search unit 39 operates in the same fashion, but this time with a search for best match with the subblock $X^{(4)}$ over the range of 128 codewords centered on the average of indices $m^{(2)}$ and $m^{(3)}$. A 7-bit index $m^{(4)}$ is transmitted from the fourth channel to the decoder. Note that the smaller range for the partial searches centered on an index relative to preceding subblock searches requires less time and requires less bits to specify the indices of the best matches found than is required for a full search over 1024 codewords for each subblock.

At the decoder, the index $m^{(1)}$ is used directly by a look-up unit 40 to extract from the codebook 31' (which is identical to the codebook 31 at the encoder) the codeword corresponding to the best match of the input subblock $X^{(1)}$ at the encoder. The absolute indices $m^{(2)}$, $m^{(3)}$, and $m^{(4)}$ are computed in units 41, 42 and 43 from the relative indices $m^{(2)}$, $m^{(3)}$ and $m^{(4)}$ transmitted by the encoder to the decoder. The computation algorithms are as shown in the drawing. The computed indices $m^{(2)}$, $m^{(3)}$ and $m^{(4)}$ are then used by look-up units 44, 45 and 46 to look up codewords corresponding to the best matches found at the encoder for the inputs $X^{(2)}$, $X^{(3)}$ and $X^{(4)}$. The outputs $Y^{(1)}$, $Y^{(2)}$, $Y^{(3)}$ and $Y^{(4)}$ from the look-up units are subblocks corresponding to the input subblocks $X^{(1)}$, $X^{(2)}$, $X^{(3)}$ and $X^{(4)}$ of the encoder. To restore the input image block 30 at the decoder, the inverse process of decimation is carried out by blocks 47, 48, 49 and 50 (which correspond to inverse decimations 24 of FIG. 2). The inverse of the distribution function carried out by the delay line 15 in FIG. 2 comprised of pixel delay units 16 is represented by a block 51 in FIG. 3(b) but is implemented as shown in FIG. 2 with pixel delay units 25 and adders 26. Since the inverse decimation units 24 restore interlaced streams of pixels, an adder 26 will always be adding an s-bit pixel value to zero from one channel or another. Consequently, each adder may be implemented with just s exclusive-OR gates which transmit the pixel value from one channel or the other, but not both. The timing of the inverse decimators 24 will assure that each adder 26 will receive a pixel value at alternate inputs and never at both inputs. The output of the last adder in the chain will thus be a high quality replica of the image input block.

PERFORMANCE ANALYSIS

The following section considers a theoretical approach to the DVQ coder performance when compared to the conventional VQ coder.

Consider the source to be one-dimensional, emitting real numbers $x_1, x_2, \ldots, x_i, \ldots$ where $-\infty < x_i < \infty$. For simplification, assume these outcomes to form a Markov chain. Thus, $$p(x_i/x_{i-1}, x_{i-2}, \ldots) = p(x_i/x_{i-1}). \tag{9}$$

Then choose the symmetric Gaussian function to be this differential probability density, $$p(x_i/x_{i-1}) = g_\sigma(x_i - x_{i-1}), \tag{10a}$$

where $$g_\sigma(x) = \frac{1}{\sqrt{2\pi\sigma^2}} e^{\frac{-z^2}{2\sigma^2}}, \tag{10b}$$

the normal density with zero mean. Assume the probability density of the first element, $x_1$ to be $q(x_1)$.

A conventional VQ coder of dimensionality K and with N codewords is applied to this source. The encoder takes K-tuples from the source to form input vectors of the form $X=(x_1, x_2, \ldots x_K)$. The joint probability density function for X is $$p(X) = p(x_1, x_2, \ldots, x_K). \tag{11}$$

No known results exists for the average distortion for arbitrary N; however, the minimum achievable average distortion for such a block quantizer for asymptotically large N is known. If $D_{VQ}$ denotes this minimum average distortion, then $$D_{VQ} = \frac{C(K,r)}{N^{r/K}} \|p(X)\|_{\frac{K}{K+r}}, \tag{12a}$$

where the distortion measure is the $l_r$-norm, and $$\|p(X)\|_\alpha = [\int [p(X)]^\alpha dX]^{1/\alpha}. \tag{12b}$$

Here $C(K,r)$ is a function independent of the source statistics, and only the upper and lower bounds are known for $K \geq 3$. The joint density, $p(X)$ in Equation (11) could be expressed as $$\begin{aligned} p(X) &= p(x_1)p(x_2/x_1)p(x_3/x_1,x_2)\ldots p(x_K/x_1,x_2,\ldots,x_{K-1}) \\ &= p(x_1)p(x_2/x_1)p(x_3/x_2)\ldots p(x_K/x_{K-1}) \text{ [from (9)]} \\ &= q(x_1)g_\sigma(x_2-x_1)g_\sigma(x_3-x_2)\ldots g_\sigma(x_K-x_{K-1}) \text{ [from (10)].} \end{aligned} \tag{13}$$

Now consider the distributed-block scheme. For some integer $d \geq 1$, every d-th outcome from the source is chosen to construct vectors of the form $$Y=(y_1,y_2,\ldots,y_K)=(x_1,x_{d+1},\ldots,x_{(K-1)d+1}). \tag{14}$$

Here $p(y_1)=p(x_1)=q(y_1)$, and $$\begin{aligned} p(y_{i+1}/y_i) &= p(x_{i+d}/x_i) \\ &= \int \ldots \int p(x_{i+d}/x_{i+d-1})\ldots p(x_{i+1}/x_i)dx_{i+d-1}\ldots dx_{i+1} \\ &= \int \ldots \int g_\sigma(x_{i+d}-x_{i+d-1})\ldots g_\sigma(x_{i+1}-x_i)dx_{i+d-1}\ldots dx_{i+1} \\ &= \underbrace{g_\sigma * g_\sigma * \ldots * g_\sigma}_{d \text{ times}}(y_{i+1}-y_i) \end{aligned} \tag{15}$$

where * means convolution. But $g_\sigma * g_\sigma * \ldots * g_\sigma = g_\xi$, where $g_\xi$ is the normal density with zero mean and variance $\xi^2 = d\sigma^2$. Therefore, Y is a vector having a similar density function to that of X, except that the functions $g_\sigma(\cdot)$ are to be replaced by $g_\xi(\cdot)$. This is expected because the correlation between data points are reduced in a distributed-block VQ. Therefore, from Equation (14) and Equation (15), $$p(Y)=q(y_1)g_\xi(y_2-y_1)g_\xi(y_3-y_2)\ldots g_\xi(y_K-y_{K-1}). \tag{16}$$

The minimum average distortion for this coder is given by $$D_{DVQ} = \frac{C(K,r)}{N^{r/K}} \|p(Y)\|_{\frac{K}{K+r}}. \tag{17}$$

Therefore, keeping all other parameters the same, the ratio of the average distortion for a VQ to a DVQ coder in Equation (12) and Equation (17) turns out to be $$\frac{D_{VQ}}{D_{DVQ}} = \frac{\|p(X)\|_\alpha}{\|p(Y)\|_\alpha}, \tag{18}$$

where $\alpha = K/(K+r)$, and $r=2$ because MSE distortion is used. Now from Equation (13), $$\int p^\alpha(X)dX = \int \ldots \int q^\alpha(x_1) g_\sigma^\alpha(x_2-x_1) \ldots g_\sigma^\alpha(x_K - x_{K-1})dx_1 \ldots dx_K \quad (19a)$$

$$= \int f(x_1, \ldots, x_{K-1})dx_1 \ldots dx_{K-1} \int_{-\infty}^{\infty} g_\sigma^\alpha(x_K - x_{K-1})dx_K$$

$$= C_\sigma \int f(x_1, \ldots, x_{K-1})dx_1 \ldots dx_{K-1}$$

where $$C_\sigma = (2\pi\sigma^2)^{(1-\alpha)/2}\alpha^{-\frac{1}{2}}. \quad (19b)$$

Proceeding this way, one gets $$\int p^\alpha(X)dX = C_q^1 C_\sigma^{K-1}, \quad (19c)$$

where $$C_q' = \int_{-\infty}^{\infty} q^\alpha(x)dx, \quad (19d)$$

and $$\int p^\alpha(Y)dY = C_q' C_\xi^{K-1} \quad (20)$$

in a similar fashion. Then from Equations (18), (19) and (20), $$\frac{D_{VQ}}{D_{DVQ}} = \left(\frac{C_\sigma^{K-1}}{C_\xi^{K-1}}\right)^{\frac{1}{\alpha}} \quad (21)$$

$$= d^{\frac{1-K}{K}}.$$

Note that for $K \gg 1$, the ratio approaches $1/d$. This means the DVQ scheme results in a factor of $d$ more average distortion than a comparable VQ scheme. This is expected since use of distributed blocks makes the vectors effectively less correlated. However, one should keep in mind that MSE distortion is not a true measure of human visual discomfort, and that the quantization error for the DVQ coder is more distributed, as opposed to localized errors for the VQ coder. Subjective quality of a distributed-block image might be almost as good with a substantial saving in bit rate.

Because the $d$ vectors of a DVQ encoder are highly correlated among themselves, the bit rate of the DVQ scheme is less than that of a similar QV counterpart. The outcomes of the Markov chain source are renamed as $$y_1^{(1)}, y_1^{(2)}, \ldots, y_1^{(d)}, y_2^{(1)}, y_2^{(2)}, \ldots, y_2^{(d)}, \ldots$$
$$, y_K^{(1)}, y_K^{(2)}, \ldots, y_K^{(d)}, \ldots \quad (22a)$$

and the DVQ input vectors of Equation (14) as $$Y^{(1)} = (y_1^{(1)}, y_2^{(1)}, \ldots, y_K^{(1)}). \quad (22b)$$

$$Y^{(d)} = (y_1^{(d)}, y_2^{(d)}, \ldots, y_K^{(d)}).$$

The joint density function in Equation (16) could also be expressed as $$p(Y) = q(y_1)g_\xi(\Delta y_2)g_\xi(\Delta y_3) \ldots g_\xi(\Delta y_K), \quad (23)$$

where $\Delta y_i = y_i - y_{i-1}$. Then for $d \geq 2, i < d$, $$p(Y^{(i+1)}/Y^{(i)}) = p(y_1^{(i+1)}, y_2^{(i+1)}, \ldots, y_K^{(i+1)}/y_1^{(i)}, y_2^{(i)}, \ldots, y_K^{(i)}) \quad (24)$$

$$= p(y_1^{(i+1)}/Y^{(i)})p(y_2^{(i+1)}/y_1^{(i+1)}, Y^{(i)}) \ldots p(y_K^{(i+1)}/y_1^{(i+1)}, \ldots, y_{K-1}^{(i+1)}, Y^{(i)})$$

$$= p(y_1^{(i+1)}/y_1^{(i)})p(y_2^{(i+1)}/y_2^{(i)}) \ldots p(y_K^{(i+1)}/y_K^{(i)}) \quad [\text{from (9), (22)}]$$

$$= g_\sigma(\Delta y_1^{(i+1)}) g_\sigma(\Delta y_2^{(i+1)}) \ldots g_\sigma(\Delta y_K^{(i+1)}),$$

where $\Delta y_j^{(i)} = y_j^{(i)} - y_j^{(i-1)}$. Because of symmetry reasons, $p(Y^{(2)}/Y^{(1)}) = p(Y^{(3)}/Y^{(2)}) = \ldots = p(Y^{(d)}/Y^{(d-1)})$. The entropy of these $d$ vectors $Y^{(1)}, Y^{(2)}, \ldots, Y^{(d)}$ is given by $$\begin{aligned} H(Y^{(1)}, Y^{(2)}, \ldots, Y^{(d)}) &= H(Y^{(1)}) + H(Y^{(2)}) + \ldots + H(Y^{(d)}) - \\ &\quad I(Y^{(1)}; Y^{(2)}) - \\ &\quad I(Y^{(2)}; Y^{(3)}) - \ldots - I(Y^{(d-1)}; Y^{(d)}) \\ &= dH(Y) - (d-1)I(Y^{(i)}; Y^{(i+1)}). \end{aligned} \quad (25)$$

For nondiscrete vector variables $Y^{(i)}$ and $Y^{(i+1)}$, the mutual information, $I(Y^{(i)}; Y^{(i+1)})$, is given by Equation (5) as $$I(Y^{(i)}; Y^{(i+1)}) = h(Y^{(i+1)}) - h(Y^{(i+1)}/Y^{(i)}) \quad (26a)$$

with the assumption that the following integrals, $$h(Y^{(i+1)}) = h(Y) = \int p(Y)\log \frac{1}{p(Y)} dY \quad (26b)$$

and $$h(Y^{(i+1)}/Y^{(i)}) = \int p(Y^{(i+1)}, Y^{(i)})\log \frac{1}{p(Y^{(i+1)}/Y^{(i)})} dY^{(i+1)} dY^{(i)} \quad (26c)$$

both exist.

Consider $h(Y)$ first. From equation (23), $$h(Y) = \int \ldots \int q(y_1)g_\xi(\Delta y_2) \ldots g_\xi(\Delta y_K) \left[ -\log q(y_1) - \sum_{i=2}^{K} \log g_\xi(\Delta y_i) \right] dy_1 d\Delta y_2 \ldots d\Delta y_K. \quad (27a)$$

But $-\log g_\xi(y) = \frac{1}{2}\log(2\pi\xi^2) + \frac{y^2}{2\xi^2}$, and $\int_{-\infty}^{\infty} \frac{y^2}{2\xi^2} g_\xi(y) dy = \frac{1}{2}$. (27b)

Therefore, $$h(Y) = \int q(y_1)\log \frac{1}{q(y_1)} dy_1 + \frac{K-1}{2} \log(2\pi e \xi^2) \qquad (17b)$$
$$= h(y_1) + \frac{K-1}{2} \log(2\pi e d\sigma^2).$$

Here it is assumed that $h(y_1)$ exists. Now consider the second integral. From equation (24), $$h(Y^{(i+1)}/Y^{(i)}) = \int p(Y^{(i)})p(Y^{(i+1)}/Y^{(i)})\log \frac{1}{p(Y^{(i+1)}/Y^{(i)})} dY^{(i+1)}dY^{(i)} \qquad (28)$$
$$= \frac{K}{2} \log(2\pi e\sigma^2)$$

following a similar way. Hence, Equation (26) becomes $$I(Y^{(i)}; Y^{(i+1)}) = h(y_1) + \frac{1}{2}\log\left(\frac{d^{K-1}}{2\pi e\sigma^2}\right). \qquad (29)$$

In case of the VQ scheme, the vectors X are assumed independent. Hence, the absolute entropy of each vector would be H(X). In the DVQ case, the average entropy of one vector is $H(Y)-(d-1)/d [I(Y^{(i)};Y^{(i+1)})]$. If we assume $H(X)\approx H(Y)$, then the DVQ coder has a bit rate saving of $(d-1)/Kd [I(Y^{(i)};Y^{(i+1)})]$ bits per sample over the VQ coder. The above assumption may seem loose because one might expect H(Y) to be larger than H(X). However, both absolute entropies are infinite here, and the mutual information between consecutive vectors is an appropriate measure of the maximum bit rate saving. Note that the indices are not compressed further by entropy coding in either scheme, therefore the quantity $H(Y)-H(X)$ is not important in this discussion. Thus, bit rate advantage per sample of the DVQ scheme over the VQ scheme is given by $$\frac{d-1}{Kd}\left[h(y_1) + \frac{1}{2}\log\left(\frac{d^{K-1}}{2\pi e\sigma^2}\right)\right]. \qquad (30)$$

Consider a VQ coder with codewords where is less than N. From Equation (12), the symptotic average distortion of this coder will be $$\left(\frac{N}{}\right)^{\frac{3}{K}} D_{VQ}. \qquad (31)$$

Equating this distortion to $D_{DVQ}$ in Equation (21), we get the following relation:

$$\frac{N}{} = d^{\frac{K-1}{2}}. \qquad (32)$$

Assuming N and to be integer powers of 2, the bit rate for the smaller VQ coder is $1/k \log_2 N/$ bit per sample less than for the original VQ coder. Comparing this bit rate with the bit rate in Equation (30), one finds that the DVQ has a lower rate than the VQ for equal average distortion so long as the following condition is satisfied, $$K < 1 + \frac{(d-1)\log 2[2h(y_1) - 1 - \log(2\pi\sigma^2)]}{\log d[d(1-\log 2) + \log 2]} \qquad (33)$$

where log refers to the natural logarithm.

Figure 5A:
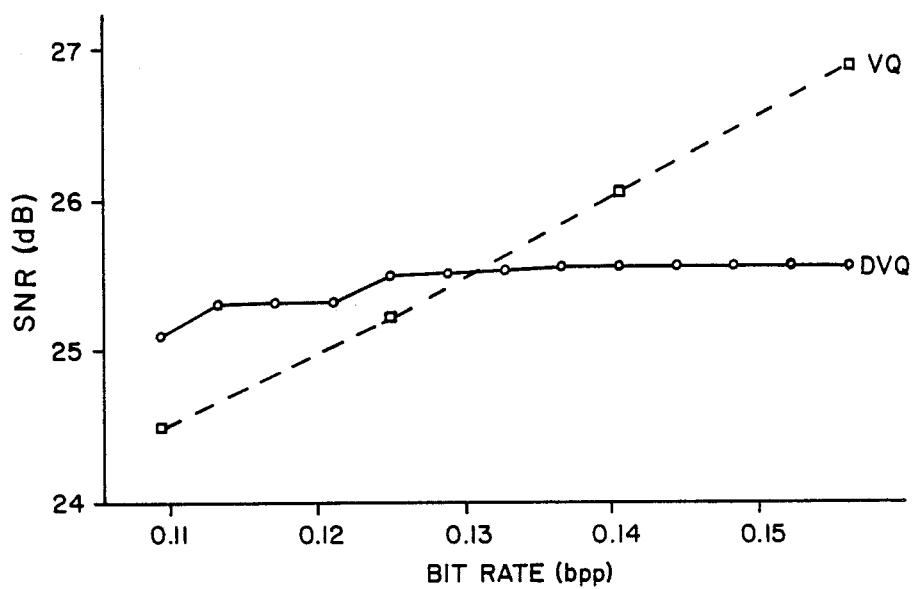
FIG. 5a is a graph of SNR comparison between DVQ and VQ cases.

Substituting d=2, K=64 in Equation (21), it is found the SNR resulting from the DVQ coder to be almost 3 dB below that of a VQ coder with the same parameters. If q(x) is taken to be normal density with a variance of $\sigma$, then $h(y_1)-\frac{1}{2} \log 2\pi e\sigma^2$ in Equation (30) becomes $\log(\sigma/\sigma)$. For gray-level image the value of $(\sigma/\sigma)$ in one dimension ranges from 10 to 50. Using this value in Equation (30), the DVQ coder will have a bit rate advantage of nearly 0.18 bit per sample over the VQ coder. These figures, however, are only true for asymptotically large N. For N=1024 with the same values of d and K, our simulation results will shown 1.3 dB reduction in SNR with 0.03 bit per pixel reduction in bit rate for the two-dimensional DVQ coder (FIG. 5a).

EXPERIMENTAL RESULTS

The DVQ coder has been applied to monochromatic images and compared with results obtained from a VQ coder. FIG. 3a shows the formation of distributed blocks from a two-dimensional pixel matrix for d=2. The coder will have $d^2$ channels and the interdependence between the channels will also be two-dimensional. A square block of size 8×8 is used, and the number of codewords, N, is taken to be 1024 or less. For reason of comparison, the training sequence and other parameters are kept exactly the same for both the coders.

The similarity function, f(C), used in the DVQ coder is the average intensity function as described by Equation (2). This function has not been optimized. The codebook has been sorted using this similarity function. The coder has four channels ranked 1, 2, 3, and 4 and the corresponding inputs $X_1$, $X_2$, $X_3$, and $X_4$. In the first encoder $b_1=1$ and $e_1=N$, so that a full search is performed for $X_1$. Because $X_4$ is least correlated to $X_1$, it is encoded next using $$b_4(m^{(1)}) = \max\left\{1, m^{(1)} - \frac{N}{2^{r_4+1}}\right\}, e_4 = b_4 - 1 + \frac{N}{2^{r_4}}. \qquad (34)$$

Figure 4:
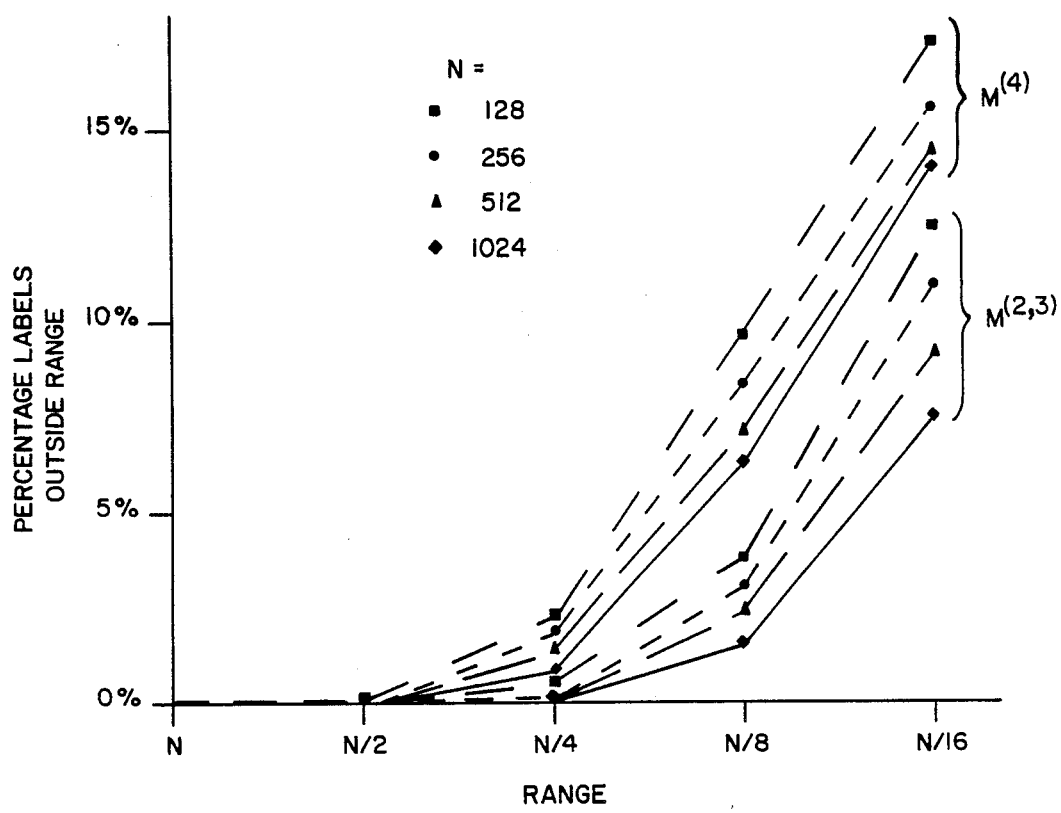
FIG. 4 is a graph of partial range coverage for a DVQ image coder.

Here the partial search range is $R_4=(N/2^{r_4})$, which saves $r_4$ bits to encode $X_4$. The strategy of encoding the two least correlated vectors first works best here because it determines the possible range for the remaining labels. $X_2$ and $X_3$ are encoded next using $$b_2(m^{(1)}, m^{(4)}) = \max\left\{1, \frac{m^{(1)} + m^{(4)}}{2} - \frac{N}{2^{r_2+1}}\right\}, \quad (35)$$

$$e_2 = b_2 - 1 + \frac{N}{2^{r_2}},$$

and similar functions for $b_3$ and $e_3$. The average saving in bits per pixel for this encoder is then $(r_2+r_3+r_4)/K$. FIG. 4 shows the percentage of times the decision made by the encoder is suboptimal for different values of $r_2$ or $r_3$, $r_4$ and N. In general a search region twice as long is required for $X_4$ to have a similar percentage as for $X_2$ or $X_3$. It should also be remembered that, even if the best match belongs outside the search range, the suboptimal match may generate only marginally more distortion. The advantages of this scheme over entropy-coded partial label transmission is that the later scheme has a variable rate and does not save computation.

FIG. 5a shows the resulting signal-to-noise ration (SNR) versus bit rate for the DVQ and VQ coders. To evaluate the code performance, peak SNR is used as given below:

$$SNR = 10 \log_{10} \frac{255^2}{E\{[\chi_{decoded}(i,j) - \chi_{original}(i,j)]^2\}}. \quad (36)$$

Here $x(i,j)$ is the intensity value of the $(i,j)$-th pixel. Our DVQ scheme had N=1024 codewords. The results show the DVQ to be superior in quality to the VQ for bit rates lower than about 0.13 bits/pixel. As has been pointed out before, the quantization errors in the DVQ are distributed which is less annoying to the viewer. The MSE distortion is unable to display this fact.

In an attempt to account for this, the SNR expression in Equation (36) could be rewritten using a vector-MSE distortion as $$SNR_{d2} = \quad (37)$$

$$10 \log_{10} \frac{255^2}{E\left\{\left(\frac{1}{d^2}\sum_{i=1}^{d}\sum_{j=1}^{d}[\chi_{decoded}(i,j) - \chi_{original}(i,j)]\right)^2\right\}}.$$

Figure 5B:
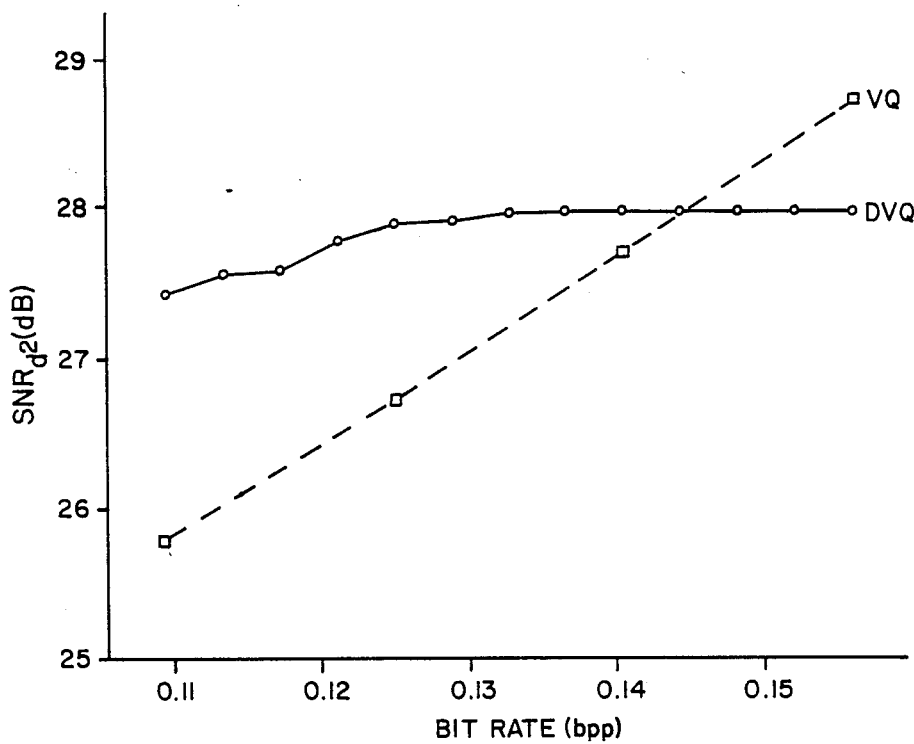
FIG. 5b is a graph of modified SNR comparison of the DVQ and the VQ coders, respectively.

FIG. 5b redraws the previous results using the modified SNR for d=2. As can be seen, the DVQ coder outperforms the VQ for bit rates lower than about 0.145 bits/pixel now.

CONCLUSIONS

A distributed vector quantization (DVQ) encoder has been described that uses distributed blocks instead of spatial blocks for encoding, which may be ideally used for greater data compression of two-dimensional image data. The coder (system of encoder and decoder) may be implemented in hardware or software. It exploits the strong correlation between the distributed input blocks to reduce both the rate and the computation required. By making $r_2$, $r_3$, $r_4$, etc. adaptive, it is easy to achieve a coder that is capable of adjusting its rate within certain ranges while compromising quality. It is shown that this coder outperforms the conventional VQ coder while coding gray-level images at low bit rate. Also, this coder has the effect of distributing the annoying quantization errors, thereby making it less visible to the human eye. The coder complexity is almost the same as the conventional scheme, and it needs no extra storage. Extension of the DVQ to distributed three-dimensional blocks for three-dimensional image data is but a natural extension of the two-dimensional distributed blocks for two-dimensional image data where the third dimension may be color, for example.

Although particular embodiments of the invention have been described and illustrated herein, it is recognized that modifications and variations may readily occur to those skilled in the art. Consequently, it is intended that the claims be interpreted to cover such modifications and variations.

I claim:

1. A system for encoding blocks of an image or voice signal comprising
   a vector quantization encoding codebook,
   means for decimating a block of pixels or samples in digital form of said input signal into subblock vectors by a selected factor d and distributing said subblock vectors through a plurality of channels in a predetermined order,
   means for vector quantization coding of said subblocks in ordered sequence of said channels using said encoding codebook in which a number N of stored vectors are ordered, said vector quantization coding means including
      a first means in a first one of said ordered channels for making a full search of stored vectors in said codebook to find a best match of a first subblock vector in said first one of said ordered channels and for outputting an index $m^{(1)}$ expressed with a minimum number of bits necessary for the number N of the best match found,
      a second means in a second one of said ordered channels for making a partial search over a localized region of stored vectors in said codebook around said index $m^{(1)}$ to find a best match of a second subblock vector in said second one of said ordered channels and for outputting the index $m^{(2)}$ of the best match found, where the index is a number expressed in fewer bits than is necessary for said index $m^{(1)}$, said index $m^{(2)}$ specifying the position of the best match in said localized region as a function of said index $m^{(1)}$, and
      an additional means for each ordered channel after said second channel for making a partial search to find a best match of each subsequent subblock vector over a localized region of stored vectors in said codebook around a position that is specified as a function of at least said index $m^{(1)}$ for the best matches of said first subblocks in said first means, and for outputting an index $m^{(i)}$ expressed in fewer bits than is necessary for said index $m^{(1)}$, said index $m^{(i)}$ specifying the position of the best match found as a function of at least said index $m^{(1)}$ for each subsequent subblock i, where i is a number specifying the order of each subsequent block.

2. A system as defined in claim 1 wherein said localized region of search by said additional region is smaller than said localized region of search by said second means, and said position around which said region of search by said additional means is localized is a function of at least said index $m^{(1)}$ and said index $m^{(2)}$.

3. A system as defined in claim 2 including a system for decoding blocks of said image or voice signal encoded in the form $m^{(1)}, \ldots m^{(i)}, \ldots m^{(n)}$ where n is the total number of channels in said system for encoding a block of said input signal and therefore the total number of encoded subblocks, said decoding system comprising
a decoding codebook identical to said encoding codebook,
means responsive to said indices $m^{(1)}, \ldots m^{(i)}, \ldots m^{(n)}$ for looking up vectors in said decoding codebook, and
means for assembling vectors read out of said decoding codebook in response to said indices $m^{(1)}, \ldots m^{(i)}, \ldots m^{(n)}$ by a process that is the inverse of said means for decimation and distribution of pixels and samples in said encoding system, thereby to output a decoded signal block that is a replica of said input signal block.

4. A system as defined in claim 3 wherein said localized region for search within said encoding codebook in the ith channel is $$\{C^{(b_i)}, C^{b_i+1}, \ldots C^{e_i}\},$$

where $b_i$ and $e_i$ denote the beginning and the end of said localized region, respectively, computed as $$b_i = m - \frac{R_i}{2}$$

$$e_i = m + \frac{R_i}{2} - 1$$

where $R_i << N$ is a specified range of the localized region for a partial search in said ith channel, and m is a function of said index $m^{(1)}$ for the second channel, a function of said indices $m^{(1)}$ and $m^{(2)}$ for the third channel, and at least a function of said indices $m^{(1)}$ and $m^{(2)}$ for subsequent channels, whereby a partial search will result in an index $m^{(i)}$ that is a function of $R_i$ and m, where m equals $m^{(1)}$ for i=2, a function of $m^{(1)}$ and $m^{(2)}$ for i=3, and m is a function of at least $m^{(1)}$ and $m^{(2)}$ for i>3, each of which requires less bits than for the index $m^{(1)}$.

5. A system as defined by claim 4 wherein said means responsive to each of said indices $m^{(i)}$ for looking up vectors in said decoding codebook computes on absolute codebook index $m^{(i)}$ from an index $m^{(i)}$ that is relative to one or more of the indexes of preceding channels as follows $$m^{(2)} = m^2 + \max\left(1, m^{(1)} - \frac{R_2}{2}\right)$$

$$m^{(3)} = m^3 + \max\left(1, \frac{m^{(1)} + m^{(2)}}{2} - \frac{R_3}{2}\right)$$

$$m^{(i)} = m^i + \max\left(1, \frac{m^{(1)} + m^{(2)}}{2} - \frac{R_i}{2}\right)$$

where $R_2$ specifies a codebook range less than N, and $R_3, \ldots, R_i$ are less than $R_2$.

6. A system as defined in claim 5 including means for adjusting said localized regions for search in channels following the first of said ordered channels by adjusting $R_i$.

* * * * *